(12) United States Patent
Loubet et al.

(10) Patent No.: US 9,166,023 B2
(45) Date of Patent: Oct. 20, 2015

(54) BULK FINFET SEMICONDUCTOR-ON-NOTHING INTEGRATION

(71) Applicants: STMicroelectronics, Inc., Coppell, TX (US); GLOBALFOUNDRIES Inc., Grand Cayman (KY)

(72) Inventors: Nicolas Loubet, Guilderland, NY (US); Prasanna Khare, Schenectady, NY (US); Jin Cho, Palo Alto, CA (US)

(73) Assignees: STMICROELECTRONICS, INC., Coppell, TX (US); GLOBALFOUNDRIES, INC., Grand Cayman (KY)

( * ) Notice: Subject to any disclaimer, the term of this patent is extended or adjusted under 35 U.S.C. 154(b) by 104 days.

(21) Appl. No.: 13/964,009

(22) Filed: Aug. 9, 2013

(65) Prior Publication Data

US 2015/0041898 A1 Feb. 12, 2015

(51) Int. Cl.
*H01L 27/12* (2006.01)
*H01L 29/66* (2006.01)
*H01L 29/78* (2006.01)

(52) U.S. Cl.
CPC ........ *H01L 29/66795* (2013.01); *H01L 29/785* (2013.01)

(58) Field of Classification Search
CPC ............... H01L 27/10826; H01L 27/10823; H01L 27/11; H01L 27/1104; H01L 27/0207; H01L 21/845; H01L 21/823821; H01L 21/823431; H01L 21/28
See application file for complete search history.

(56) References Cited

U.S. PATENT DOCUMENTS

| | | | | |
|---|---|---|---|---|
| 2007/0145483 A1* | 6/2007 | Ono | ........... | H01L 21/28291 257/353 |
| 2010/0258870 A1* | 10/2010 | Hsu | ........... | H01L 29/785 257/347 |
| 2011/0309333 A1* | 12/2011 | Cheng | ........... | B82Y 10/00 257/24 |
| 2012/0292707 A1* | 11/2012 | Toh | ........... | B82Y 10/00 257/365 |
| 2013/0146942 A1* | 6/2013 | Zhu | ........... | H01L 29/66795 257/190 |
| 2014/0151746 A1* | 6/2014 | Loubet | ........... | H01L 29/66795 257/192 |
| 2014/0175554 A1* | 6/2014 | Loubet | ........... | H01L 21/823431 257/368 |
| 2014/0191321 A1* | 7/2014 | Cheng | ........... | H01L 21/76283 257/347 |
| 2014/0264594 A1* | 9/2014 | Adam | ........... | H01L 29/66795 257/347 |
| 2014/0374839 A1* | 12/2014 | He | ........... | H01L 27/0886 257/401 |

OTHER PUBLICATIONS

Morin et al., U.S. Appl. No. 14/027,758, filed Sep. 16, 2013.

\* cited by examiner

*Primary Examiner* — Victor A Mandala
(74) *Attorney, Agent, or Firm* — Allen, Dyer, Doppelt, Milbrath & Gilchrist, P.A.

(57) ABSTRACT

Methods and structures for forming fully insulated finFETs beginning with a bulk semiconductor substrate are described. Fin structures for finFETs may be formed in two epitaxial layers that are grown over a bulk substrate. A first epitaxial layer may be sacrificial. A final gate structure may be formed around the fin structures, and the first epitaxial layer removed to form a void between a fin and the substrate. The void may be filled with an insulator to fully insulate the fin.

17 Claims, 12 Drawing Sheets

BULK FINFET SEMICONDUCTOR-ON-NOTHING INTEGRATION

BACKGROUND

1. Technical Field

The technology relates to methods and structures for making fully insulated finFETs starting with bulk semiconductor wafers.

2. Discussion of the Related Art

Transistors are fundamental device elements of modern digital processors and memory devices, and have found numerous applications in various areas of electronics including high-power applications. Currently, there are a variety of transistor designs or types that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and superjunction or multi-drain transistors. One type of transistor that has emerged within the MOSFET family of transistors is a fin field-effect transistor (finFET).

Figure 1:
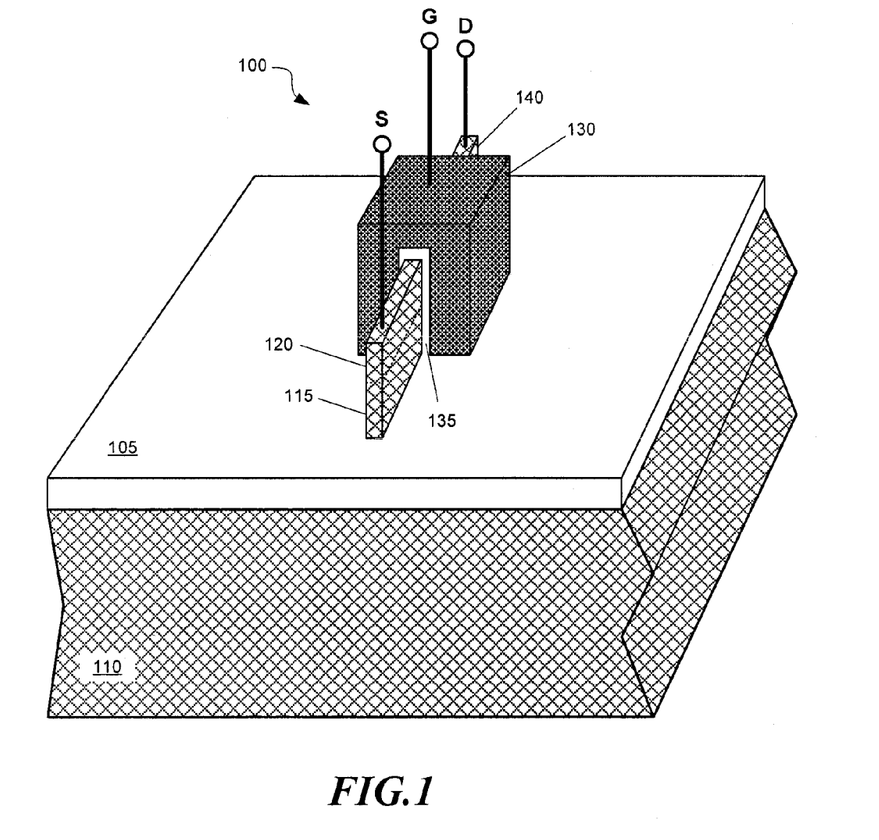
FIG. 1 is a perspective view of a finFET formed on a bulk substrate.

An example of a finFET 100 is depicted in the perspective view of FIG. 1. A finFET may be fabricated on a bulk semiconductor substrate 110, e.g., a silicon substrate, and comprise a fin-like structure 115 that runs in a length direction along a surface of the substrate and extends in a height direction normal to the substrate surface. The fin 115 may have a narrow width, e.g., less than 250 nanometers. There may be an insulating layer 105, e.g., an oxide layer, on a surface of the substrate. The fin may pass through the insulating layer 105, but be attached to the semiconducting substrate 110 at a lower region of the fin. A gate structure comprising a conductive gate material 130 (e.g., polysilicon) and gate insulator 135 (e.g., an oxide) may be formed over a region of the fin. Upper portions of the fin may be doped on either side of the gate structure to form a source region 120 and drain region 140 adjacent to the gate.

FinFETs have favorable electrostatic properties for complimentary MOS scaling to smaller sizes. Because the fin is a three-dimensional structure, the transistor's channel can be formed on three surfaces of the fin, so that the finFET can exhibit a high current switching capability for a given surface area occupied on substrate. Since the channel and device can be raised from the substrate surface, there can be reduced electric field coupling between adjacent devices as compared to conventional planer MOSFETs.

SUMMARY

The described technology relates to methods and structures for making semiconductor-on-nothing (SON) fins for finFET devices. The SON fins may be formed from epitaxially-grown semiconductor material on a bulk substrate, and may be completely detached from a semiconductor substrate at a lower region near the substrate. The SON fins may be insulated all around the fin in a gate region and insulated from the substrate in source and drain regions to provide a fully insulated finFET device having single or multiple fins.

According to some embodiments, a method for making a fully insulated finFET may comprise acts of forming a fin in first semiconductor material at a surface of a substrate, and forming at least a portion of a final gate structure for the fin. The portion of the final gate structure may be used for the completed finFET device. The method may further include forming, after forming at least the portion of the final gate structure, a void between the fin and the semiconductor substrate that isolates the fin from the substrate. In some implementations, the method further includes filling the void with an insulating material, and epitaxially growing a second semiconductor material to merge a source region of the fin with at least one other source region of at least one other fin.

Structures related to the methods are also contemplated. In some embodiments, a semiconductor-on-nothing finFET structure comprises at least a portion of a final gate structure, a semiconductor fin supported by the gate structure, and a void between the semiconductor fin and a substrate. The void may fully isolate the semiconductor fin from the substrate. In some implementations, source and drain regions of the fin may be exposed to air or a gas on all sides and suspended over the substrate.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

FIGS. 2A-2G depict process steps that may be used to form fin structures, e.g., via a sidewall image transfer process, according to some embodiments;

FIGS. 2H-2P-2 depict process steps that may be used to form semiconductor-on-nothing fins, according to some embodiments; and FIGS. 2Q-1-2R depict process steps that may be used to form fully-insulated finFET devices, according to some embodiments.

The features and advantages of the embodiments will become more apparent from the detailed description set forth below when taken in conjunction with the drawings.

DETAILED DESCRIPTION

As noted above, finFETs exhibit favorable current-to-size switching capabilities for integrated circuits, and finFETs like those shown in FIG. 1 have been fabricated in high density on bulk silicon (Si) substrates. FinFETs also exhibit favorable electrostatic properties for scaling to high-density, low-power, integrated circuits. Because the fin and channel are raised from the substrate, the devices can exhibit reduced cross-coupling between proximal devices. For the device shown in FIG. 1, the fin 115 may be formed from the bulk substrate 110 by an etching process, and is therefore attached to the substrate at a base region of the fin, a region occluded in the drawing by the adjacent insulator 105. Because the fin 115 is attached to the semiconductor substrate, leakage current and cross-coupling may occur via the base region of the fin.

Some approaches to fully isolating a finFET include forming a semiconducting fin above an insulator. This may be done by deposition of a semiconductor material on the insulator, and subsequent annealing of the semiconductor on the insulating layer on a substrate. In some cases, a fin may be formed in an upper semiconductor layer of a silicon-on-insulator wafer. These approaches may lead to fins of lower crystalline quality, or require higher-cost substrates or processing steps.

Figure 2:
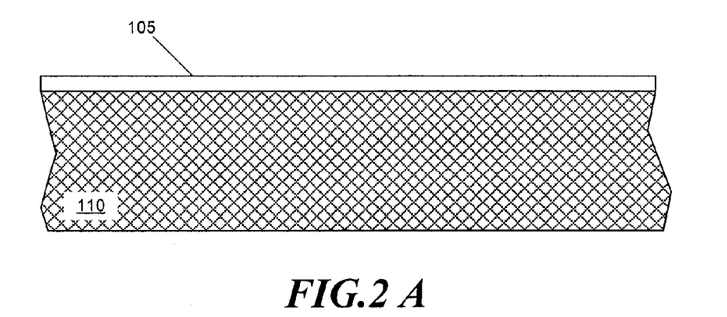
Figure 2C:
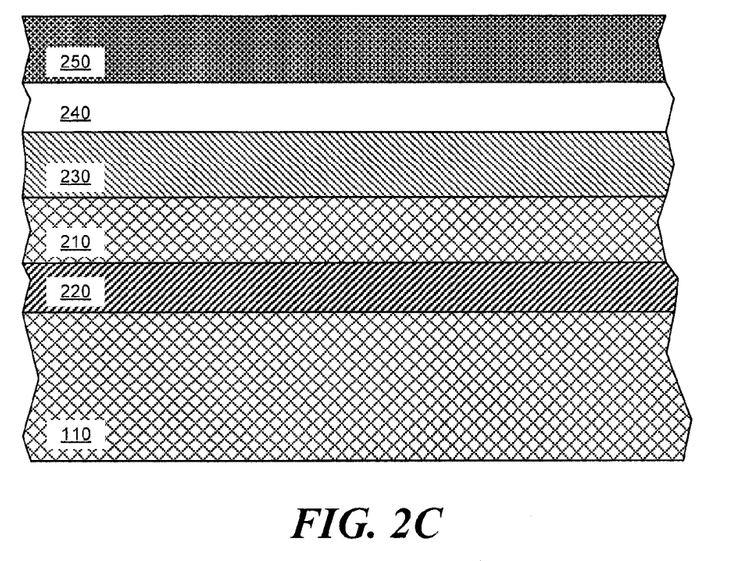
Figure 2E:
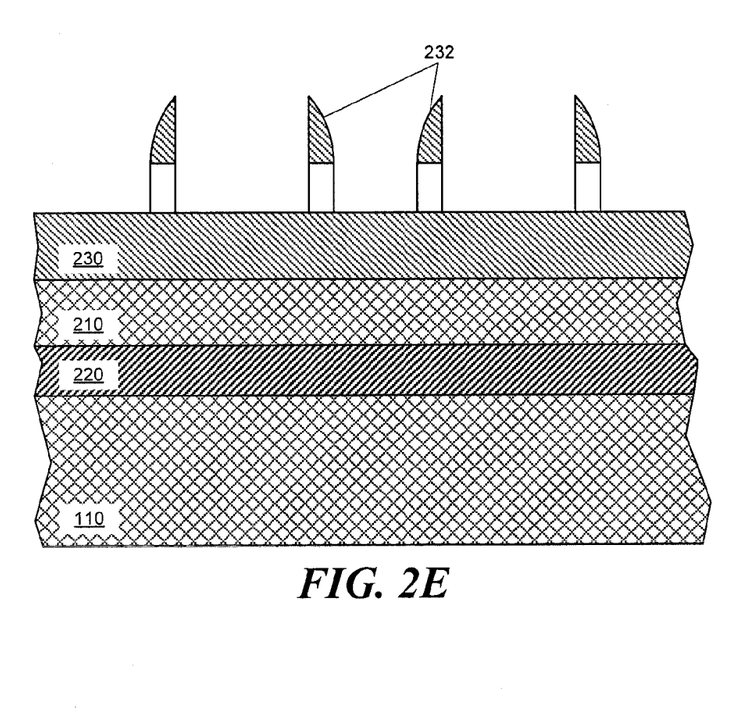
Figure 2F:
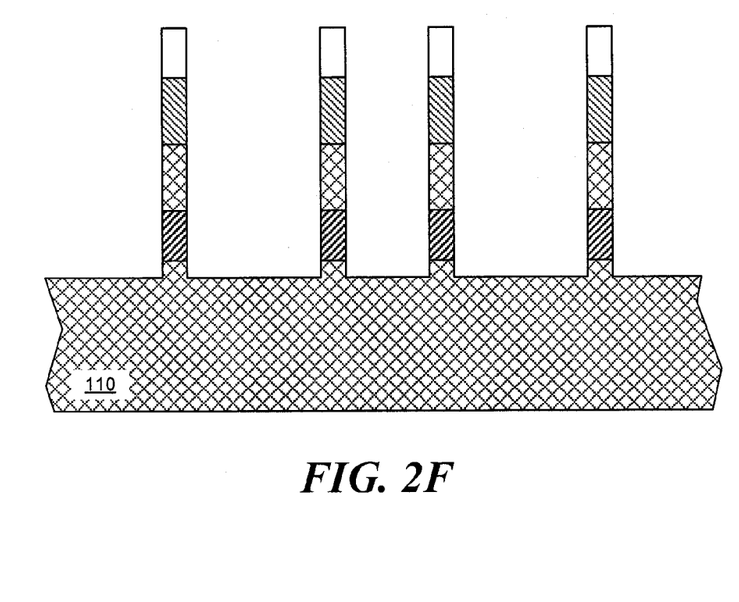
Figure 2K:
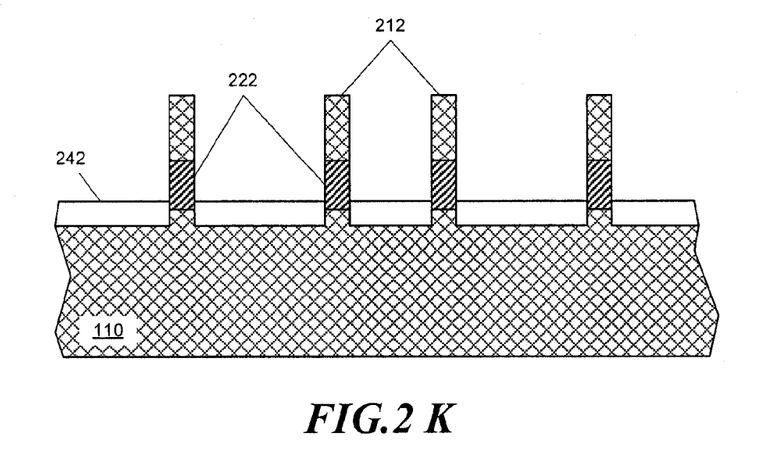
Figure 2L:
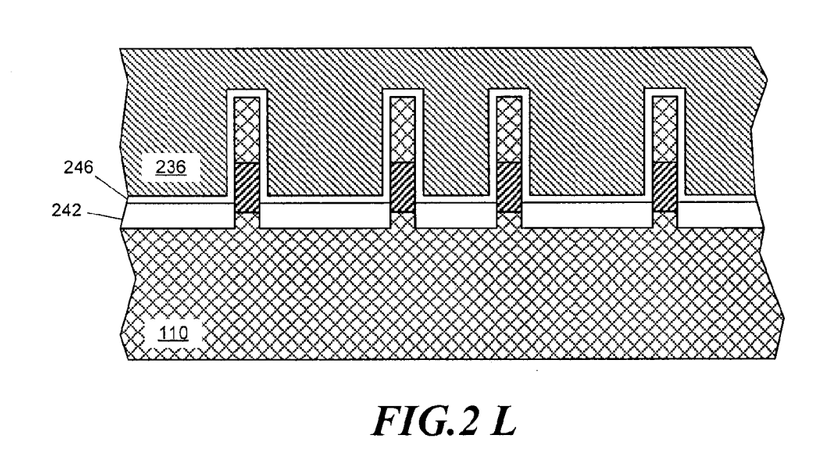
Figure 2O:
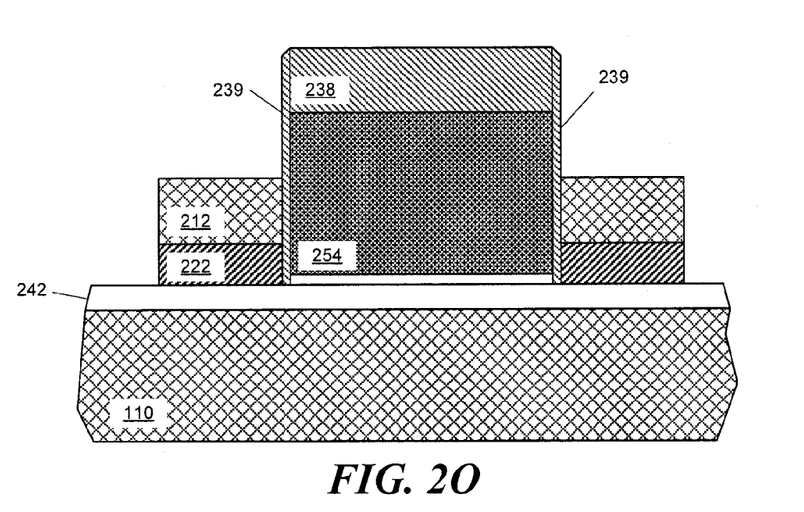
Figure 2P:
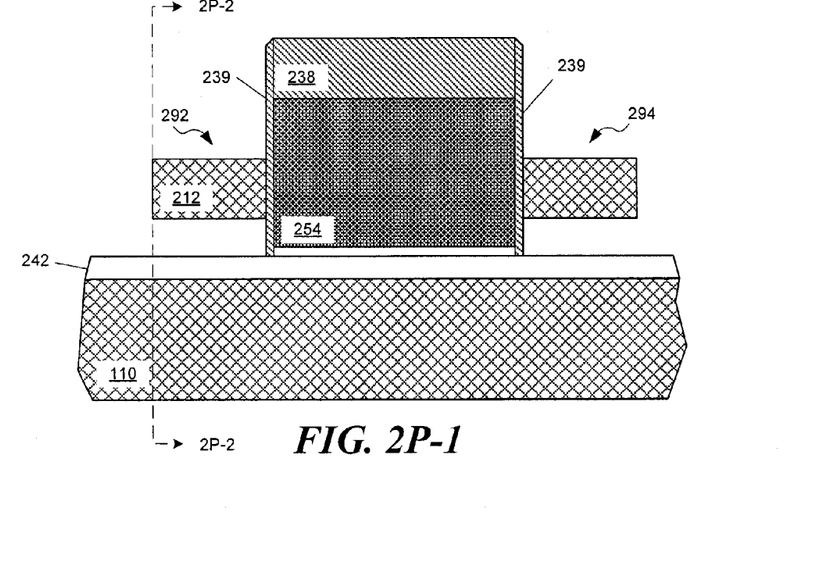
Figure 2P:
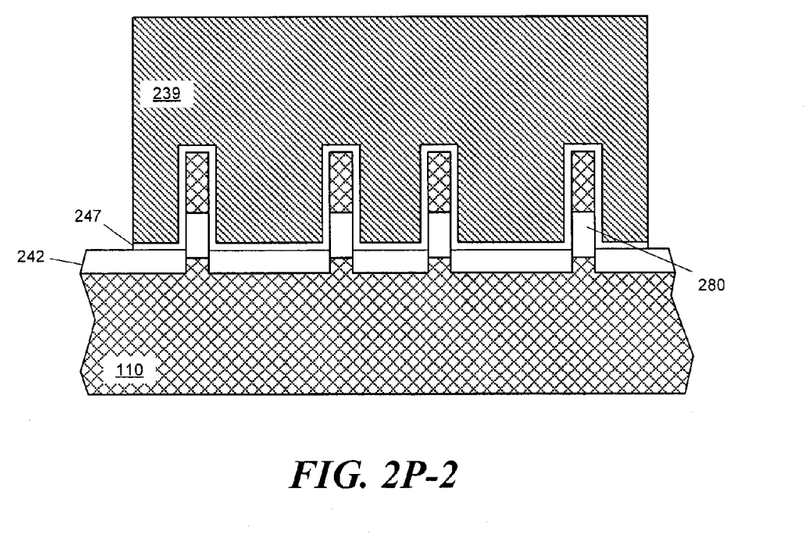
Figure 2R:
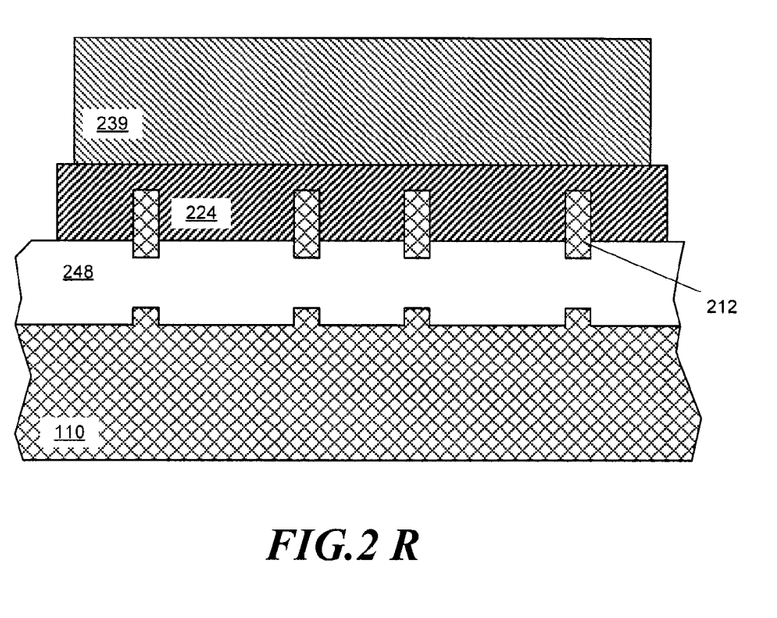

FIGS. 2A-2R depict process steps that may be used to fabricate semiconductor-on-nothing (SON) fins and/or fully-insulated finFET devices, beginning with a bulk semiconductor substrate. In overview, the fins may be formed from epitaxially-grown semiconductor, and therefore be of high crystalline quality. After the fins are formed, at least a portion of a final gate structure is formed over the fins. The gate structure may provide a support structure for the fins. (See FIGS. 2N-1, 2N-2) Subsequently, voids may be formed between the fins and the substrate, such that the fins 212 are isolated from the substrate 110, as depicted in FIGS. 2P-1, 2P-2. An insulating material may be deposited in the voids formed between the fins and substrate to fully insulate the fin from the substrate.

A process for forming semiconductor-on-nothing fins may begin with a substrate 110 of a first semiconductor material upon which an insulator 105 may be formed, as depicted in FIG. 2A. The insulator may be a pad oxide in some embodiments, and may be formed by any suitable process, e.g., a thermal oxidation process or a plasma deposition process. The substrate may be a semiconducting substrate (e.g., a bulk Si substrate), though other semiconducting materials may be used in other embodiments. The insulator may comprise $SiO_2$, though any suitable insulator may be used. The thickness of the insulator may be any value between approximately 5 nanometers (nm) and approximately 2 microns (m).

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

With reference to FIG. 2B, at a region where fins for finFETs are to be formed, the insulator 105 may be removed from the substrate surface (e.g., by a photolithography and etching process) to open wells in the insulator. In some embodiments, the insulator 105 may be removed from the entire surface of the substrate 110. In other embodiments, a pad oxide or trench isolation may be subsequently formed around regions that include finFET transistors.

Where the substrate surface is exposed, a second semiconductor material 220 (e.g., SiGe) may be epitaxially grown over the surface. Subsequently, a layer of the first semiconductor material 210 may be epitaxially grown over the second semiconductor material. Because of the epitaxial growth of the second semiconductor material 220 and first semiconductor material 210, the crystalline quality of the first semiconductor material 210 is high. The first semiconductor material 210 forms a layer in which fins for fully insulated finFETs may be formed.

The thickness of the first semiconductor material 210 may be between 10 nm and 100 nm in some embodiments, between 20 nm and 50 nm in some embodiments, and in some embodiments may be about 30 nm. The thickness of the second semiconductor material 220 may be between 10 nm and 100 nm in some embodiments, between 20 nm and 50 nm in some embodiments, and in some embodiments may be about 30 nm. In various embodiments, the thicknesses of the first and second semiconductor materials are thin enough, such that defect density is less than about $10^5$ cm$^{-2}$.

The fins may be patterned by a sidewall image transfer (SIT) process that is depicted by steps illustrated in FIGS. 2C-2F. For this process, additional layers may be deposited over the epitaxial layers, as depicted in FIG. 2C. A hard mask layer 230 may be deposited over the first semiconductor material 210. The hard mask layer may comprise silicon nitride (e.g., $Si_3N_4$) in some embodiments, though any suitable hard mask material may be used that exhibits etch selectivity over the underlying semiconductor materials. The thickness of the hard mask material may be between 10 nm and 100 nm in some embodiments, between 20 nm and 50 nm in some embodiments, and in some embodiments may be approximately 40 nm.

On the hard mask layer 230 an insulating layer 240 may be formed. The insulating layer may comprise undoped silicate glass (USG), and its thickness may be between 10 nm and 100 nm in some embodiments, between 20 nm and 50 nm in some embodiments, and in some embodiments may be approximately 30 nm. The USG layer may be applied by any suitable means, e.g., via a plasma deposition process, or a spin-on and anneal process.

A patterning layer 250 may be deposited over the insulating layer 240. In some embodiments, the patterning layer 250 may comprise amorphous silicon that is deposited by a plasma deposition process, though any suitable material may be used. The patterning layer 250 may be between 10 nm and 100 nm in some embodiments, between 20 nm and 50 nm in some embodiments, and in some embodiments may be approximately 40 nm.

Referring to FIG. 2D, bar-like structures 252 may be patterned in the patterning layer 250 using any suitable method, e.g., photolithography and etching. In some embodiments, the bar-like structures may be patterned using a mandrel lithography process. In some implementations, the bar-like structures may be patterned using interferometric lithography techniques. The bar-like structures 252 may extend for a length L (into the page) that is a desired length for a fin of a finFET transistor. The width W and spacing S of the bar-like structures may be chosen to provide desired spacings between multiple fins of a finFET device or between multiple finFET devices.

A blanket masking layer (not shown) may be deposited over the bar-like structures 252 and insulating layer 240. In some embodiments, the blanket masking layer may comprise silicon nitride that is deposited by a plasma deposition process. The thickness of the masking layer may be between 50 nm and 100 nm in some embodiments, between 5 nm and 50 nm in some embodiments, and in some embodiments may be about 15 nm. The masking layer may be etched away to form spacer structures 232 adjacent the bar-like structures 252, as depicted in FIG. 2D. A series of etching steps may then be used to pattern fins in the first semiconductor layer 210, where the spacer structures 232 define the pattern of the fins.

For example, a first selective, anisotropic etch may be performed to remove the bar-like structures 252. The same etch recipe, or a different etch recipe may be used to remove most of the insulating layer 240 except where protected by the spacer structures 232, thereby transferring the pattern of the spacer structures 232 to the insulating layer. The resulting structure may appear as depicted in FIG. 2E. A second selective, anisotropic etch may be performed to remove most of the hard mask layer 230, thereby transferring the pattern from the insulating layer to the hard mask layer 230. If the hard mask layer 230 and spacer structures 232 are formed of the same material, most of the spacer structures may be removed during the etch. Additional selective, anisotropic etches may be performed to transfer the pattern from the hard mask layer to the underlying first semiconductor material 210 and second semiconductor material 220 layers. The resulting structure may be as depicted in FIG. 2F. In some embodiments, the additional etching may proceed into the substrate 110 between approximately 5 nm and approximately 50 nm. In some implementations, the additional etching may stop at approximately the surface of the substrate 110.

The upper insulating material 240 may be removed from the substrate (e.g., using a wet or dry etch) leaving exposed hard mask features 234, as depicted in FIG. 2G. The entire region may be covered with an insulator 242, e.g., using a TEOS trench isolation process, as depicted in FIG. 2H. In some embodiments, the insulator may be an oxide, e.g., $SiO_2$. A planarization step may be carried out to remove excess insulator 242 and expose the tops of the hard mask feature 234, as depicted in FIG. 2I. The planarization may be achieved by chemical mechanical polishing (CMP), in some embodiments, and may stop on the hard mask features 234.

The hard mask features 234 may then be removed, e.g., by a wet or dry etch, as depicted in FIG. 2J. The insulator 242 may be etched back using a local isolation recess process to yield a structure as depicted in FIG. 2K. The remaining insulating layer 242 may have a thickness that is less than a height of the second semiconductor layer, so that the base features 222 are exposed, as indicated in FIG. 2K. The base features may support the fins 212 that have been etched in the first semiconductor material 210. Since the base features 222 and fins 212 are both formed in epitaxially-grown materials, the fins are of high semiconductor crystalline quality and may provide device performance comparable to that of conventional bulk semiconductor planar devices. Additionally, the resulting finFETs, when fully insulated, may exhibit benefits of improved device isolation and favorable current-to-size scaling for low-power applications.

In some embodiments, a tetraethyl orthosilicate (TEOS) process may be used to coat the region with a thin insulating layer 246. For example, the TEOS may be applied as a solution or via a plasma, e.g., via a coating process, and then converted to $SiO_2$ by baking the substrate. In some embodiments, the thin insulating layer 246 may be applied using a plasma deposition process. A pad nitride layer 236 may be formed over the structures and planarized, e.g., using a CMP process, to yield the structure shown in FIG. 2L.

The pad nitride 236 and insulating layer 246 may be removed subsequently using a wet etch. The wet etch may comprise a mixture of hydrofluoric acid and a solution containing a high heat resistant coating material (e.g., HP 500 available from Hitachi). According to some embodiments, the wet etch removes the pad nitride layer 236 and the insulator 246 to again expose the fins 212 and at least a portion of the base features 222, as depicted in FIG. 2M.

According to some embodiments, the deposition and removal of the insulating layer 246 and pad nitride layer 236, as depicted in FIGS. 2L-2M, may be done for the purpose of forming deep STI regions at locations of the substrate 110 that may be adjacent to or removed from the finFET structures. The insulating layer 246 and pad nitride layer 236 may protect the fin structures during formation of the deep STI regions. After depositing the pad nitride layer 236, deep trenches may be formed at the STI locations and filled using a TEOS process. The substrate may then be planarized using a CMP process, stopping on the pad nitride layer 236. The pad nitride may then be removed using a wet etch, in some embodiments. For example, phosphoric acid may be used to remove the pad nitride layer 236, stopping at the insulating layer 246. The phosphoric acid etch may be highly selective, such that it readily etches the pad nitride, but does not, or slowly, etches the insulating layer.

With the fins 212 and at least a portion of the base features 222 exposed, at least a portion of a final gate structure 295 for the finFETs may be formed over the fins, as depicted in FIG. 2N-1. For example, the at least a portion of the final gate structure may comprise a gate insulator 247, formed over the fins 212 and base structures, and a gate conductor 254, formed over the gate insulator 247. The gate insulator 247 may be a TEOS oxide or any suitably formed insulator having a thickness between approximately 1 nm and approximately 10 nm. In some embodiments, the gate conductor 254 may comprise amorphous silicon, though any suitable conductor may be used. A planarization step, e.g., a CMP step, may be used to planarize the conductor 254 after its deposition.

The gate conductor and gate insulator may be patterned using photolithography. For example, a hard mask material 238 (such as silicon nitride) may be deposited and patterned over the gate conductor 254, and then used to define, by etching, a gate structure over a central region of one or more of the fins 212. The at least a portion of the final gate structure may appear as depicted in FIG. 2N-1 and FIG. 2N-2. The view of the structure in FIG. 2N-1 is from an end of the fins 212, and the view in FIG. 2N-2 is from a side of the fins.

Spacers 239 may be formed adjacent the gate structures, as depicted in FIG. 2O. In some embodiments, the spacers may be formed from silicon nitride that is deposited by a plasma deposition process to coat the region, and then anisotropically etched (e.g., via reactive ion etching) to remove most of the thin nitride layer except on the sidewalls of the gate structure. The process of forming the spacers 239 may use some of the same steps that were used to form the spacer structures 232 described above in connection with FIG. 2D.

The substrate may then be subjected to an etch that is selective to base structures 222, and that does not etch the fins 212. In some embodiments, the etch may comprise a wet hydrochloric acid that is selective to SiGe according to the example above. The etch may remove the SiGe base structures 222 to form voids 280 between the fins 212 and the substrate 110, as depicted in FIG. 2P-1 and FIG. 2P-2. The ends of the fins may be supported above the substrate by the final gate structure 295 such that they are surrounded by air or a gas, as depicted in FIG. 2P-1.

Voids 280 located under the gate structure may be filled with an insulator 248, e.g., using any suitable field oxide (FOX) process. In some embodiments, a spin-on glass may be used to fill the voids, followed by a densification anneal at elevated temperatures. The FOX insulator 248 may overcoat the fins 212 in some embodiments (not depicted in the drawings), and a SiCoNi etch may be used to etch back the FOX and expose at least an upper portion of the fins 212, as depicted in FIG. 2Q-1 and FIG. 2Q-2. As can be seen from FIG. 2Q-1, the fins are fully insulated from the substrate 110 and from each other. According to some embodiments, the ends of the fins may be doped, e.g., via ion implantation, to form source and drain regions of the finFETs. The gate structure 295 and spacers 239 may provide a mask for self-aligned doping.

According to some embodiments, an epitaxial growth may be used to form semiconductor merging features 224 at source regions 292 and at drain regions 294 of adjacent fins, as depicted in FIG. 2R. The merging features 224 may be used to form source and drain contacts. The epitaxial growth may include a dopant that can be thermally driven into the source and drain regions of the fins from the merging features at moderate temperatures. According to some embodiments, a spike anneal process may be used to drive in the dopants. For example, the substrate may be subjected to a rapid temperature increase to a temperature in a range between about 1000° C. and about 1060° C., and then a rapid decrease in temperature. The duration of the spike anneal may be between approximately 1 to approximately 5 seconds. In some embodiments, the semiconductor merging features may comprise epitaxially grown SiGe or SiC that may be doped with boron or phosphor. In some embodiments, the semiconductor merging features may consist essentially of epitaxially grown Si.

In some implementations, the semiconductor merging features 224 may be grown so as to impart strain to the channel regions of the finFETs. For example, if the fins 212 are formed from epitaxially-grown Si, and the semiconductor merging features 224 are formed from epitaxially-grown SiGe or SiC, lattice mismatches between the materials may impart strain to the channel regions of the devices. The strain may improve the mobility of carriers in the channel regions.

Although the examples described above are primarily directed to Si/SiGe semiconductor combinations, other semiconductor combinations may be used in other embodiments. For example, equivalent process steps may be implemented for GaAs, GaN, InP, and other semiconductor materials.

Although the processing steps depicted in FIGS. 2A-2R illustrate one method for forming fully insulated finFETs, in other embodiments, there may be additional steps or fewer steps. According to some embodiments, the steps associated with forming and removing a TEOS insulator 246 and pad nitride 236 in connection with FIG. 2L may be omitted. Accordingly, a portion of the final gate structure 295 may be formed over the structure shown in FIG. 2K. In some embodiments, an etching step may be used after forming the structure shown in FIG. 2P-1 to remove the hard mask material 238 from the top of the gate conductor 254, yet retain the spacers 239.

The fins shown in the drawings may be spaced laterally from each other on one or more regular spacing intervals. For example, there may be a uniform lateral spacing $d_1$ between all fins. Alternatively, there may be two uniform lateral spacings $d_1$, $d_2$ alternating between successive fins, as depicted in FIG. 2M. The fins may have a width between approximately 5 nm and approximately 30 nm. The fins may be spaced apart between approximately 10 nm and approximately 50 nm. There may be one or more fins per finFET device. A finFET device fabricated according to the present teachings may be formed in an integrated circuit in large numbers and at high densities. The circuits may be used for various low-power applications, including but not limited to, circuits for operating smart phones, computers, tablets, PDA's and other consumer electronics.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for making a semiconductor device comprising:
    forming a plurality of fins comprising a first semiconductor material at a surface of a substrate;
    forming respective source and drain regions in the fins;
    forming at least a portion of a final gate structure for the fins;
    forming, after forming at least the portion of the final gate structure, a respective void between each fin and the semiconductor substrate that isolates the fins from the substrate;
    filling the voids with an insulating material; and
    epitaxially growing a second semiconductor material to merge source regions of the fins;
    wherein the source and drain regions of the fins are freely suspended above the substrate.

2. The method of claim 1, further comprising:
    forming a plurality of base structures on the substrate, and wherein forming the plurality of fins comprises forming a respective fin on each of the base structures; and
    removing the base structures to form the voids.

3. The method of claim 2 wherein forming the base structures comprises epitaxially growing the base structures on the substrate, and wherein forming the fins comprises epitaxially growing the fins on the base structures.

4. The method of claim 3, wherein the substrate comprises bulk Si, the base structure comprises SiGe, and the fins comprise Si.

5. The method of claim 1, wherein the insulating material comprises an oxide.

6. The method of claim 1, further comprising selecting the second semiconductor material to impart a strain to channel regions of the fins.

7. The method of claim 1, wherein the first semiconductor material comprises Si and the second semiconductor material comprises SiGe.

8. The method of claim 1, wherein a spacing between any two adjacent fins is between approximately 10 nm and approximately 50 nm.

9. The method of claim 1, wherein the second semiconductor material includes a dopant.

10. The method of claim 9, further comprising heating the first and second semiconductor materials to drive the dopant into the source regions of the fins.

11. The method of claim 1, wherein the fins are formed by a sidewall image transfer process.

12. The method of claim 1, wherein the fins have a width between approximately 5 nm and approximately 30 nm and a height between approximately 20 nm and approximately 50 nm.

13. A finFET device comprising:
    a gate structure above a substrate;
    a plurality of semiconductor fins supported by the gate structure above the substrate, the semiconductor fins comprising a first semiconductor material, and each semiconductor fin having a respective source and drain therein;
    an insulating material between the fins and the substrate isolating the fins from the substrate; and
    a second semiconductor material merging the source regions of the fins;
    wherein the source and drain regions of the fins are freely suspended above the substrate.

14. The finFET structure of claim 13, wherein the gate structure comprises a gate insulator over the fins and a gate electrode over the gate insulator.

15. The finFET structure of claim 13, wherein the source and drain regions of the fins are freely suspended between approximately 20 nm and approximately 50 nm above the substrate.

16. The finFET structure of claim 13, further comprising sidewall spacers adjacent the gate structure.

17. The finFET structure of claim 13, wherein the fins have a width between approximately 5 nm and approximately 30 nm and a height between approximately 20 nm and approximately 50 nm.

\* \* \* \* \*